US012772839B2

(12) United States Patent
Yoon et al.

(10) Patent No.: US 12,772,839 B2
(45) Date of Patent: Oct. 20, 2026

(54) BOTH-SURFACE COOLING SEMICONDUCTOR DEVICE

(71) Applicant: POWER MASTER SEMICONDUCTOR CO., LTD., Cheongju-si (KR)

(72) Inventors: Ki-Myung Yoon, Bucheon-si (KR); In-Suk Kim, Bucheon-si (KR); Jooyaung Eom, Gimpo-si (KR)

(73) Assignee: POWER MASTER SEMICONDUCTOR CO., LTD., Cheongju-si (KR)

( * ) Notice: Subject to any disclaimer, the term of this patent is extended or adjusted under 35 U.S.C. 154(b) by 350 days.

(21) Appl. No.: 18/691,542

(22) PCT Filed: Sep. 14, 2022

(86) PCT No.: PCT/KR2022/013675
§ 371 (c)(1),
(2) Date: Mar. 13, 2024

(87) PCT Pub. No.: WO2023/043163
PCT Pub. Date: Mar. 23, 2023

(65) Prior Publication Data
US 2024/0387313 A1    Nov. 21, 2024

(30) Foreign Application Priority Data
Sep. 14, 2021 (KR) ........................ 10-2021-0122488

(51) Int. Cl.
*H10W 40/10* (2026.01)
*H10W 40/40* (2026.01)
(Continued)

(52) U.S. Cl.
CPC ........... *H10W 40/10* (2026.01); *H10W 40/40* (2026.01); *H10W 70/461* (2026.01);
(Continued)

(58) Field of Classification Search
CPC ..... H10W 40/10; H10W 40/47; H10W 70/40; H10W 70/461; H10W 72/00;
(Continued)

(56) References Cited

U.S. PATENT DOCUMENTS 9,831,160 B2 11/2017 Kadoguchi et al.
2011/0037166 A1 * 2/2011 Ikeda ................. H10W 40/255 257/E23.101
(Continued)

FOREIGN PATENT DOCUMENTS

KR 10-0751286 8/2007
KR 10-2013-0014881 2/2013
(Continued)

OTHER PUBLICATIONS

KIPO, PCT Search Report & Written Opinion of PCT/KR2022/013675 dated Dec. 26, 2022.

*Primary Examiner* — Brook Kebede
(74) *Attorney, Agent, or Firm* — LEX IP MEISTER, PLLC

(57) ABSTRACT

Provided are a dual cooling semiconductor device and a dual cooling semiconductor system. The dual cooling semiconductor device includes: a first cooling structure and a second cooling structure each including a thermally conductive electrical insulation layer; a first internal metal plate formed on an upper surface of the second cooling structure; a second internal metal plate formed on a lower surface of the first cooling structure; a third internal metal plate formed on the first internal metal plate and supporting a semiconductor chip; a metal block formed on the semiconductor chip; and a fourth internal metal plate formed below the second internal metal plate and having a metal block insertion hole into which the metal block is inserted.

8 Claims, 6 Drawing Sheets

(51) Int. Cl.
*H10W 70/40* (2026.01)
*H10W 74/10* (2026.01)
*H10W 72/00* (2026.01)
*H10W 72/30* (2026.01)
*H10W 90/00* (2026.01)

(52) U.S. Cl.
CPC .... *H10W 74/111* (2026.01); *H10W 72/07354* (2026.01); *H10W 72/347* (2026.01); *H10W 90/00* (2026.01); *H10W 90/736* (2026.01)

(58) Field of Classification Search
CPC ........... H10W 72/07354; H10W 72/30; H10W 72/347; H10W 74/10; H10W 74/111; H10W 90/00; H10W 90/736
See application file for complete search history.

(56) References Cited

U.S. PATENT DOCUMENTS

| | | | | |
|---|---|---|---|---|
| 2016/0005676 | A1* | 1/2016 | Orimoto | H10W 40/22 257/714 |
| 2018/0211938 | A1* | 7/2018 | Tsuyuno | H10W 90/00 |

FOREIGN PATENT DOCUMENTS

| | | |
|---|---|---|
| KR | 10-2018-0002957 | 1/2018 |
| KR | 10-2018-0131130 | 12/2018 |

* cited by examiner

BOTH-SURFACE COOLING SEMICONDUCTOR DEVICE

CROSS-REFERENCE TO RELATED APPLICATION

This application claims priority to and the benefit of Korean Patent Application No. 10-2021-0122488 filed in the Korean Intellectual Property Office on Sep. 14, 2021, the entire contents of which are incorporated herein by reference.

BACKGROUND

(a) Technical Field

The disclosure relates to a dual cooling semiconductor device.

(b) Description of the Related Art

A power semiconductor may convert power supplied from the power source or battery of any device using power to voltage and current levels required by any of various systems (for example, an automobile), and manage power of the entire system. The power semiconductor may be used in the form of a module in which individual elements, integrated circuits, and multiple elements are integrated into a package based on its application purpose and voltage resistance feature. The power semiconductor is required to be able to be operated in a harsh environment having a high operation temperature and a long operation times, thus requiring high reliability. In this regard, research is actively being conducted on a method of dually cooling a semiconductor device to cope with high heat generation of the power semiconductor.

SUMMARY

The disclosure attempts to provide a dual cooling semiconductor device including a cooling structure formed in the semiconductor device to thus have improved cooling efficiency and a simpler process of its assembly with an external cooling structure.

According to an embodiment, provided is a dual cooling semiconductor device including: a first cooling structure and a second cooling structure each including a thermally conductive electrical insulation layer; a first internal metal plate formed on an upper surface of the second cooling structure; a second internal metal plate formed on a lower surface of the first cooling structure; a third internal metal plate formed on the first internal metal plate and supporting a semiconductor chip; a metal block formed on the semiconductor chip; and a fourth internal metal plate formed below the second internal metal plate and having a metal block insertion hole into which the metal block is inserted.

The first cooling structure and the second cooling structure may each include the metal plate therein.

The device may further include one or more molded resin flowing-out prevention concavo-convex structures.

A cross-sectional shape of the metal block insertion hole and a cross-sectional shape of the metal block may be circular.

The device may further include a third cooling structure attached to a lower surface of the second cooling structure and including one or more coolant entrances.

The device may further include a fourth cooling structure attached to the lower surface of the first cooling structure and including one or more coolant entrances.

A third cooling structure and a fourth cooling structure may form one cooling structure and may be formed by a bent or deformed metal.

According to an embodiment, provided is a dual cooling semiconductor system including: the dual cooling semiconductor device described above; an external cooling structure; and an interconnection layer including a thermal conductivity material and connecting the dual cooling semiconductor device with the external cooling structure.

DETAILED DESCRIPTION OF THE EMBODIMENTS

Figure 1:
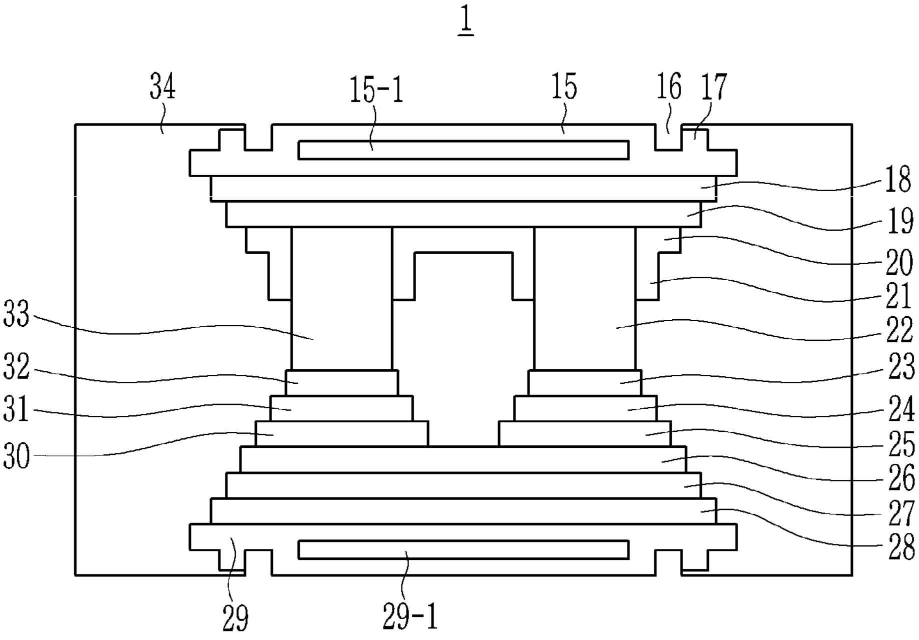
FIG. 1 is a diagram for explaining a dual cooling semiconductor device according to an embodiment.

Hereinafter, embodiments of the disclosure are described in detail with reference to the accompanying drawings for those skilled in the art to which the disclosure pertains to easily practice the disclosure. However, the disclosure may be modified in various different forms, and is not limited to the embodiments provided herein. In addition, in the drawings, portions unrelated to the description are omitted to clearly describe the disclosure, and similar portions are denoted by similar reference numerals throughout the specification.

Through the specification and the claims, unless explicitly described otherwise, "including" any components will be understood to imply the inclusion of another component rather than the exclusion of another component.

Figure 2:
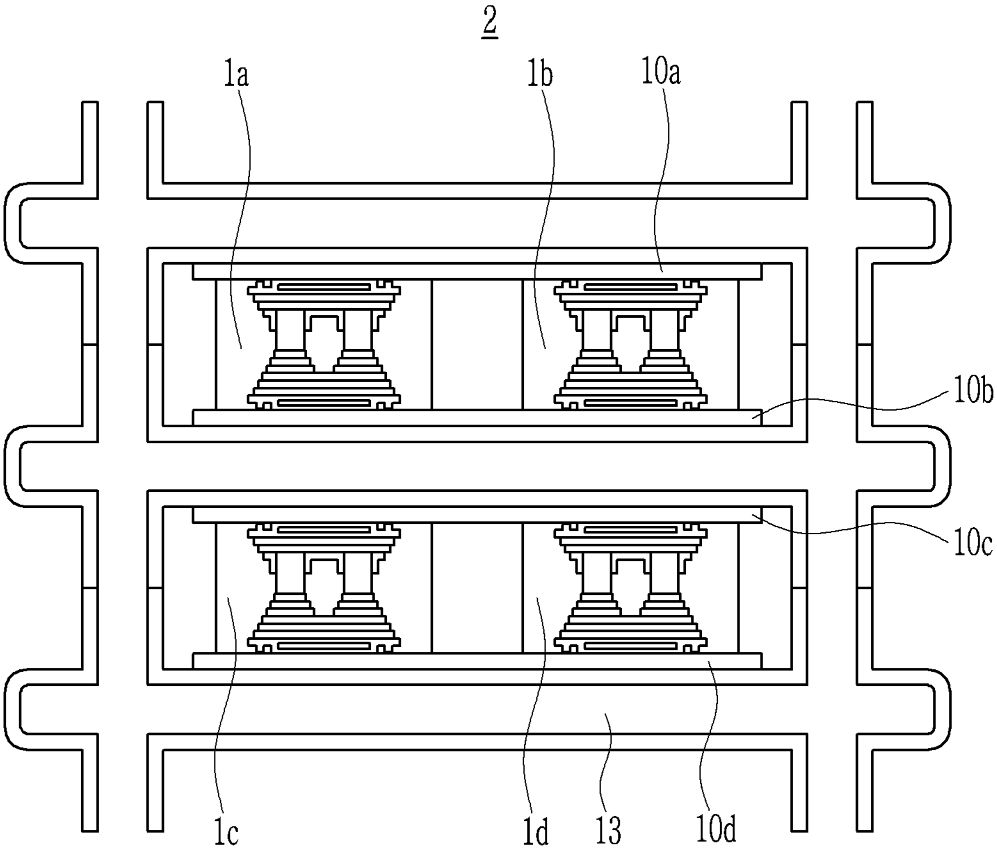
FIG. 2 is a diagram for explaining a dual cooling semiconductor system according to an embodiment.

FIG. 1 is a diagram for explaining a dual cooling semiconductor device according to an embodiment, and FIG. 2 is a diagram for explaining a dual cooling semiconductor system according to an embodiment.

Referring to FIG. 1, a dual cooling semiconductor device 1 according to an embodiment may include cooling structures 15 and 29.

The cooling structures 15 and 29 may each include a thermally conductive electrical insulation layer. The thermally conductive electrical insulation layer may be manufactured using a thermally conductive material having an electrically insulating feature. For example, the thermally conductive electrical insulation layer may include a ceramic material. As another example, the thermally conductive electrical insulation layer may include a polymer composite material in the form of a composite material in which a large amount of polymer material and a metal-based, carbon-based, or ceramic-based filler are mixed with each other. As still another example, the thermally conductive electrical insulation layer may include a material powdered as powders having a high heat transfer feature as well as a high insulating feature, such as aluminum oxide ($Al_2O_3$), aluminum nitride (AlN), silicon nitride ($Si_3N_4$), and then processed at a high temperature (e.g., about 600 degrees Celsius or more). In this way, it is possible to improve the deterioration, shorter lifespan, and lower reliability of its product that may occur due to greatly increased heat density in a limited area by selecting such a thermally conductive electrical insulation layer as a heat control material.

In some embodiments, the cooling structures 15 and 29 may respectively further include metal plates 15-1 and 29-1. When forming the powders of the thermally conductive electrical insulation layer, the metal plates 15-1 and 29-1 may be disposed in the cooling structures 15 and 29. The cooling structure 15 or 29 may include the metal plate 15-1 or 29-1 to thus increase thermal conductivity of the thermally conductive electrical insulation layer, thus preventing microcracks which may occur due to a pressure when the cooling structure 15 or 29 is coupled with an external cooling structure 13.

In some embodiments, the metal plate 15-1 or 29-1 may be included without any surface exposed into the cooling structure 15 or 29, and in some other embodiments, one surface of the metal plate 15-1 or 29-1 may be exposed to the outside through one surface of the cooling structure 15 or 29. Alternatively, in some other embodiments, the cooling structure 15 or 29 may not include the metal plate 15-1 or 29-1.

The dual cooling semiconductor device 1 may further include a molded resin layer 34 filling a space between the cooling structures 15 and 29. The molded resin layer 34 may correspond to the electrical insulation layer. In some embodiments, the dual cooling semiconductor device 1 may include one or more molded resin flowing-out prevention concavo-convex structures 16 and 17. The molded resin flowing-out prevention concavo-convex structures 16 and 17 may prevent resin from flowing out when the molded resin layer 34 fills the space between the cooling structures 15 and 29. Due to the molded resin flowing-out prevention concavo-convex structures 16 and 17, it is possible to omit a post-molding polishing process for removing the flowing-out resin or a pre-molding film attachment process for preventing the resin from flowing out, thus simplifying a manufacturing process and saving cost and time.

A first internal metal plate 28 may be formed on an upper surface of the cooling structure 29. The first internal metal plate 28 may be a metal plate which may be bonded by soldering or sintering. For example, the first internal metal plate 28 may be formed by applying at least one of nickel, silver, tin, lead, and copper to the upper surface of the cooling structure 29, and an application method may include selective immersion in a metal solution, paste application, electroless plating, or the like. The application may be performed at a step of manufacturing the cooling structure 29. Meanwhile, a second internal metal plate 18 may be formed on a lower surface of the cooling structure 15, and the description of the first internal metal plate 28 may be referred to for the second internal metal plate 18.

A third internal metal plate 26 may be formed on the first internal metal plate 28. The third internal metal plate 26 may serve to support semiconductor chips 24 and 31. The first internal metal plate 28 and the third internal metal plate 26 may be bonded to each other through a solder layer or sintered bonding layer 27. In the embodiments, the solder layer may include, for example, silver, tin, lead, copper, or a combination of these metals, and the sintered bonding layer may include silver, copper, or a combination of these metals.

The semiconductor chips 24 and 31 may be power semiconductor devices. The power semiconductor device may include a silicon controlled rectifier (SCR), a silicon carbide (SiC), an insulated gate bipolar transistor (IGBT), a field effect transistor (FET), a metal oxide semiconductor field effect transistor (MOSFET), a power rectifier, a power regulator or the like. In particular, the power semiconductor device may use a power MOSFET device, and may be operated at a high voltage and a high current and have a double-diffused metal oxide semiconductor (DMOS) structure unlike a regular MOSFET. However, the scope of the disclosure is not limited to these examples. The semiconductor chip 24 or 31 may be attached to the third internal metal plate 26 through a solder layer or sintered bonding layer 25 or 30. In some embodiments, wire connection may be formed between the semiconductor chip 24 or 31 and the third internal metal plate 26 as needed.

Metal blocks 22 and 33 may respectively be formed on the semiconductor chips 24 and 31. Meanwhile, a fourth internal metal plate 20 having a metal block insertion hole may be formed below the second internal metal plate 18. Here, a cross-sectional shape of the metal block insertion hole may be circular and each cross-sectional shape of the metal blocks 22 and 33 may also be circular. The metal blocks 22 and 33 may respectively be inserted into the metal block insertion holes formed in the fourth internal metal plate 20 through a mechanical pressure, and firmly fixed thereto. A cross-sectional diameter of the metal block 22 or 33 and a cross-sectional diameter of the metal block insertion hole may be determined to ensure a sufficient fixing force between the two elements. For example, the cross-sectional diameter of the metal block insertion hole may be the same as or slightly smaller than the cross-sectional diameter of the metal block 22 or 33. In some embodiments, a cross section of the metal block 22 or 33 and a cross section of the metal block insertion hole may be formed in a shape other than the circular shape. The structure of the metal block 22 or 33 and the structure of the fourth internal metal plate 20 may provide the sufficient fixing force to the internal elements of the semiconductor device 1 while making assembly of the semiconductor device 1 and its manufacturing process easier, thereby improving the assembly completeness of the semiconductor device 1.

A lower surface of the metal block 22 or 33 may be attached to the semiconductor chip 24 or 31 through a solder layer or sintered bonding layer 23 or 32. In addition, each upper surface of the metal blocks 22 and 33 and the fourth internal metal plate 20 may be attached to the second internal metal plate 18 through a solder layer or sintered bonding layer 19.

Next, referring to FIG. 2, a semiconductor device 1*a*, 1*b*, 1*c*, or 1*d* manufactured as described with reference to FIG. 1 may be connected to the external cooling structure 13 through an interconnection layer 10*a*, 10*b*, 10*c*, or 10*d*, which is made of a thermal conductivity material, to thus form a semiconductor system 2. A coolant may flow in the external cooling structure 13. In general, the external cooling structure 13 may be made of a metal material, and an electrical short circuit may thus occur if the semiconductor device 1*a*, 1*b*, 1*c*, or 1*d* is assembled between the external cooling structures 13. To prevent the short circuit, a layer having the thermal conductivity and electrical insulation may need to be formed between the semiconductor device 1*a*, 1*b*, 1*c*, or 1*d* and the external cooling structure 13.

For this purpose, it is possible to consider a method of forming the thermally conductive electrical insulation layer between the interconnection layers 10*a*, 10*b*, 10*c*, and 10*d*. However, in this method, the interconnection layer 10*a*, 10*b*, 10*c*, or 10*d* may have a three-layer structure in which a thermal conductivity layer, the thermally conductive electrical insulation layer, and a thermal conductivity layer are stacked, which may lead to a complicate manufacturing and assembly processes and an increased thickness. As a result, there may be a restriction on a size of the semiconductor device 1*a*, 1*b*, 1*c*, or 1*d* assembled with the external cooling structure 13.

On the other hand, as described above with reference to FIG. 1, the cooling structures 15 and 29 may be already formed as the electrical insulation layer in the semiconductor device 1*a*, 1*b*, 1*c*, or 1*d*. Therefore, the interconnection layer 10*a*, 10*b*, 10*c*, or 10*d* may only need to have the thermal conductivity and may not necessarily have to have the electrical insulation. Therefore, according to this embodiment, it is possible to prevent the electrical short circuit, simplify the manufacturing and assembly processes, and it may also be advantageous in terms of the size of semiconductor device 1*a*, 1*b*, 1*c*, or 1*d* by simply forming the interconnection layer 10*a*, 10*b*, 10*c*, or 10*d* having a one-layer structure.

In detail, four thermal conductivity layers and two thermally conductive electrical insulation layers may be required in case that the interconnection layer 10*a* or 10*b* are implemented as having three layers when assembling the semiconductor device 1*a* or 1*b* to the external cooling structure 13. Furthermore, a total of 28 thermal conductivity layers and 14 thermally conductive electrical insulation layers, disposed in a vertical direction, may be required in case that a region where the semiconductor device 1*a* or 1*b* is disposed is repeatedly assembled 7 times. In contrast, only one thermal conductivity layer may be required in case that the interconnection layer 10*a* or 10*b* is implemented as one layer according to the embodiments when assembling the semiconductor device 1*a* or 1*b* to the external cooling structure 13. Furthermore, only a total of 14 thermal conductivity layers may be required to be formed in the vertical direction in case that the region where the semiconductor device 1*a* or 1*b* is disposed is repeatedly assembled 7 times.

Figure 3:
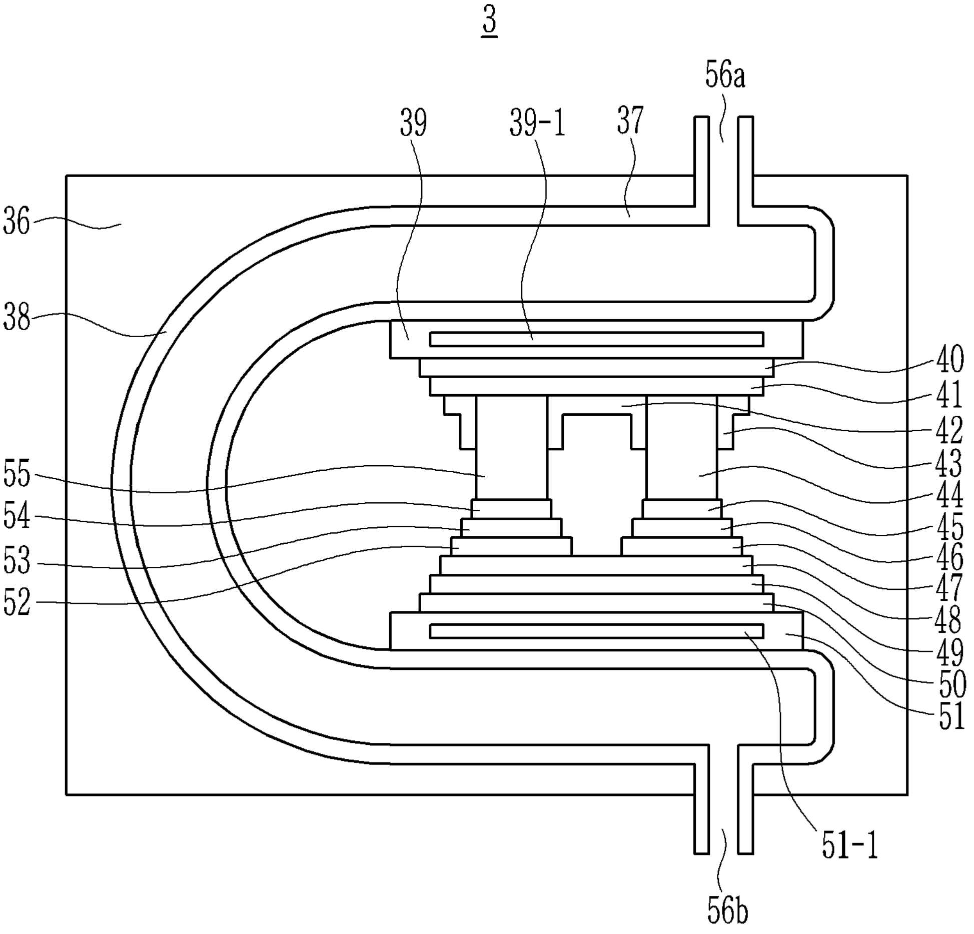
FIG. 3 is a diagram for explaining a dual cooling semiconductor device according to an embodiment.

FIG. 3 is a diagram for explaining a dual cooling semiconductor device according to an embodiment.

Referring to FIG. 3, a dual cooling semiconductor device 3 according to an embodiment may include cooling structures 39 and 51.

The cooling structures 39 and 51 may each include the thermally conductive electrical insulation layer. The thermally conductive electrical insulation layer may be manufactured using the thermally conductive material having the electrically insulating feature. For example, the thermally conductive electrical insulation layer may include the ceramic material. As another example, the thermally conductive electrical insulation layer may include the polymer composite material in the form of the composite material in which the large amount of polymer material and the metal-based, carbon-based, or ceramic-based filler are mixed with each other. As still another example, the thermally conductive electrical insulation layer may include the material powdered as the powders having the high heat transfer feature as well as the high insulating feature, such as aluminum oxide ($Al_2O_3$), aluminum nitride (AlN), silicon nitride ($Si_3N_4$), and then processed at the high temperature (e.g., about 600 degrees Celsius or more). In this way, it is possible to improve the deterioration, shorter lifespan, and lower reliability of its product that may occur due to the greatly increased heat density in the limited area by selecting such the thermally conductive electrical insulation layer as the heat control material.

In some embodiments, the cooling structures 39 and 51 may respectively further include metal plates 39-1 and 51-1. When forming the powders of the thermally conductive electrical insulation layer, the metal plates 39-1 and 51-1 may be disposed in the cooling structures 39 and 51. The cooling structure 39 or 51 may include the metal plate 39-1 or 51-1 to thus increase the thermal conductivity of the thermally conductive electrical insulation layer, thus preventing the microcracks which may occur when the cooling structure 39 or 51 is coupled with the external cooling structure.

In some embodiments, the metal plate 39-1 or 51-1 may be included without any surface exposed into the cooling structure 39 or 51, and in some other embodiments, one surface of the metal plate 39-1 or 51-1 may be exposed to the outside through one surface of the cooling structure 39 or 51. Alternatively, in some other embodiments, the cooling structure 39 or 51 may not include the metal plate 39-1 or 51-1.

A first internal metal plate 50 may be formed on an upper surface of the cooling structure 51. The first internal metal plate 50 may be the metal plate which may be bonded by soldering or sintering. For example, the first internal metal plate 50 may be formed by applying at least one of nickel, silver, tin, lead, and copper to the upper surface of the cooling structure 51, and the application method may include the selective immersion in the metal solution, the paste application, the electroless plating, or the like. The application may be performed at a step of manufacturing the cooling structure 51. Meanwhile, a second internal metal plate 40 may be formed on a lower surface of the cooling structure 39, and the description of the first internal metal plate 50 may be referred to for the second internal metal plate 40.

The dual cooling semiconductor device 3 may further include a cooling structure 37. The cooling structure 39 or 51 may be attached to the cooling structure 37, for example, by a method of high temperature surface melting at about 600 degrees Celsius or more, oxide film melting, or direct attachment of aluminum or copper at about 1000 degrees Celsius or more. In detail, a lower surface of the cooling structure 51 may be attached to one end of the cooling structure 37 where a coolant entrance 56*b* is disposed, and an upper surface of the cooling structure 39 may be attached to the other end of the cooling structure 37 where a coolant entrance 56*a* is disposed.

In the manufacturing process, the first internal metal plate 50 may first be formed on the upper surface of the cooling structure 51, and the lower surface of the cooling structure 51 may then be bonded to the cooling structure 37. Alternatively, in an opposite order, the lower surface of the cooling structure 51 may first be bonded to the cooling structure 37, and the first internal metal plate 50 may then be formed on the upper surface of the cooling structure 51. Likewise, the second internal metal plate 40 may first be formed on the lower surface of the cooling structure 39, and the upper surface of the cooling structure 39 may then be bonded to the cooling structure 37. Alternatively, in an opposite order, the upper surface of the cooling structure 39 may first be bonded to the cooling structure 37, and the second internal metal plate 40 may then be formed on the lower surface of the cooling structure 39.

In this embodiment, the cooling structure 37 may be formed in a shape of a bent or deformed metal 38. Accordingly, the first internal metal plate 50 and the second internal metal plate 40, which are respectively bonded to the cooling structure 37, may oppose each other. In addition, the coolant entrance 56*a* and the coolant entrance 56*b*, formed in the cooling structure 37, may form a straight line in the vertical direction in the drawing. Due to this shape of the cooling structure 37, it is possible to maximize cooling efficiency of the dual cooling semiconductor device 3. Meanwhile, a pressing process using a jig may be performed on both ends of the cooling structure 37 before the soldering or sintering bonding process.

The dual cooling semiconductor device 3 may further include a molded resin layer 36 filling its interior. The molded resin layer 36 may entirely cover the cooling structure 37 formed in the shape of the bent or deformed metal 38, and expose only the coolant entrances 56*a* and 56*b*.

A third internal metal plate 48 may be formed on the first internal metal plate 50. The third internal metal plate 48 may serve to support semiconductor chips 46 and 53. The first internal metal plate 50 and the third internal metal plate 48 may be bonded to each other through a solder layer or sintered bonding layer 49.

The semiconductor chips 46 and 53 may be the power semiconductor devices as described above with reference to FIG. 1. The semiconductor chip 46 or 53 may be attached to the third internal metal plate 48 through a solder layer or sintered bonding layer 47 or 52. In some embodiments, the wire connection may be formed between the semiconductor chip 46 or 53 and the third internal metal plate 48 as needed.

Metal blocks 44 and 55 may respectively be formed on the semiconductor chips 46 and 53. Meanwhile, fourth internal metal plates 42 and 43 each having the metal block insertion hole may be formed below the second internal metal plate 40. Here, a cross-sectional shape of the metal block insertion hole may be circular and each cross-sectional shape of the metal blocks 44 and 55 may also be circular. The metal blocks 44 and 55 may respectively be inserted into the metal block insertion holes formed in the fourth internal metal plates 42 and 43 through the mechanical pressure, and firmly fixed thereto. A cross-sectional diameter of the metal block 44 or 55 and a cross-sectional diameter of the metal block insertion hole may be determined to ensure a sufficient fixing force between the two elements. For example, the cross-sectional diameter of the metal block insertion hole may be the same as or slightly smaller than the cross-sectional diameter of the metal block 44 or 55. In some embodiments, a cross section of the metal block 44 or 55 and a cross section of the metal block insertion hole may be formed in the shape other than the circular shape. The structure of the metal block 44 or 55 and the structure of the fourth internal metal plate 42 or 43 may provide the sufficient fixing force to the internal elements of the semiconductor device 3 while making assembly of the semiconductor device 3 and its manufacturing process easier, thereby improving the assembly completeness of the semiconductor device 3.

A lower surface of the metal block 44 or 55 may be attached to the semiconductor chip 46 or 53 through a solder layer or sintered bonding layer 45 or 54. In addition, each upper surface of the metal blocks 44 and 55 and the fourth internal metal plates 42 and 43 may be attached to the second internal metal plate 40 through a solder layer or sintered bonding layer 41.

According to this embodiment, the assembly process of the external cooling structure (for example, the external cooling structure 13 in FIG. 2 or an external cooling structure 93 in FIG. 6) may be simplified, and only the coolant entrances 56*a* and 56*b* may be required to be connected, thus having increased manufacturing convenience. In addition, the thermally conductive electrical insulation layer such as the cooling structure 39 or 51 may be protected by the resin layer 36. Therefore, these layers may prevent microcracks which may occur due to the pressure when the cooling structure 15 or 29 is coupled with the external cooling structure. In addition, the metal plates operated electrically in the dual cooling semiconductor device 3 may not be exposed. Therefore, it is possible to omit the post-molding polishing process for removing the resin or the pre-molding film attachment process for preventing the resin from flowing out, thus simplifying the manufacturing process and saving the cost and time.

Figure 4:
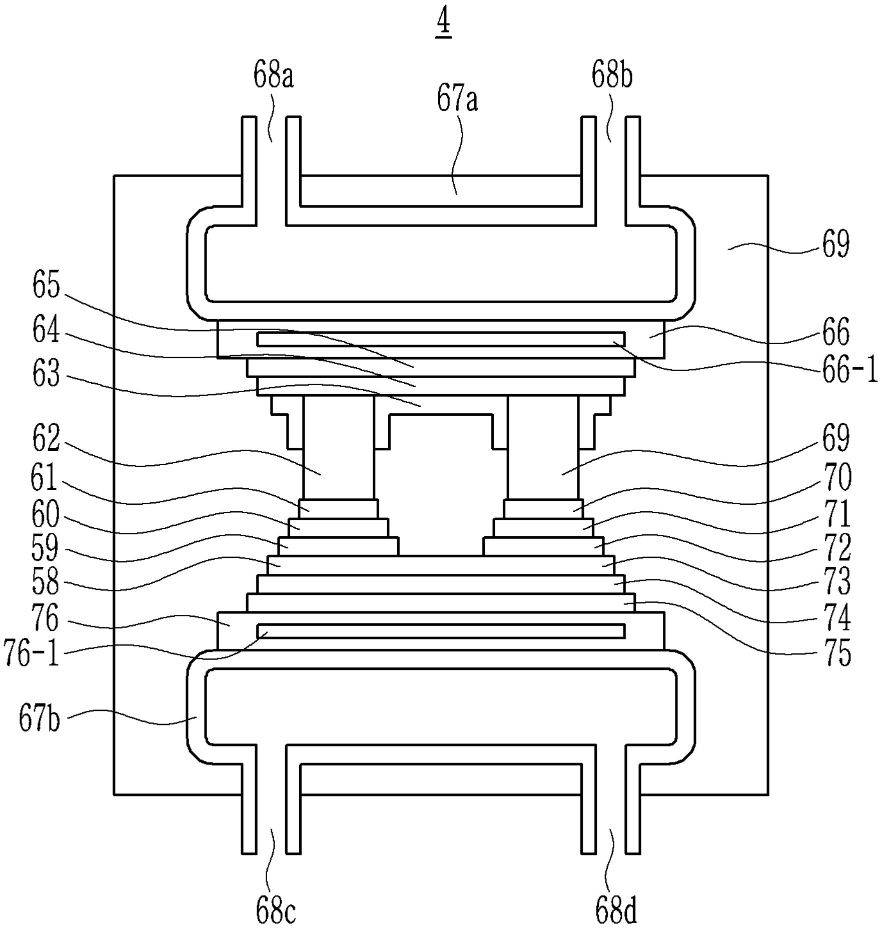
FIG. 4 is a diagram for explaining a dual cooling semiconductor device according to an embodiment.

FIG. 4 is a diagram for explaining a dual cooling semiconductor device according to an embodiment.

Referring to FIG. 4, a dual cooling semiconductor device 4 according to an embodiment may include cooling structures 66 and 76.

The cooling structures 66 and 76 may each include the thermally conductive electrical insulation layer. The thermally conductive electrical insulation layer may be manufactured using the thermally conductive material having the electrically insulating feature. For example, the thermally conductive electrical insulation layer may include the ceramic material. As another example, the thermally conductive electrical insulation layer may include the polymer composite material in the form of the composite material in which the large amount of polymer material and the metal-based, carbon-based, or ceramic-based filler are mixed with each other. As still another example, the thermally conductive electrical insulation layer may include the material powdered as the powders having the high heat transfer feature as well as the high insulating feature, such as aluminum oxide ($Al_2O_3$), aluminum nitride (AlN), silicon nitride ($Si_3N_4$), and then processed at the high temperature (e.g., about 600 degrees Celsius or more). In this way, it is possible to improve the deterioration, shorter lifespan, and lower reliability of its product that may occur due to the greatly increased heat density in the limited area by selecting such the thermally conductive electrical insulation layer as the heat control material.

In some embodiments, the cooling structures 66 and 76 may respectively further include metal plates 66-1 and 76-1. When forming the powders of the thermally conductive electrical insulation layer, the metal plates 66-1 and 76-1 may be disposed in the cooling structures 66 and 76. The cooling structure 66 or 76 may include the metal plate 66-1 or 76-1 to thus increase the thermal conductivity of the thermally conductive electrical insulation layer, thus preventing the microcracks which may occur when the cooling structure 66 or 76 is coupled with the external cooling structure (e.g., coolant supply casting).

In some embodiments, the metal plate 66-1 or 76-1 may be included without any surface exposed into the cooling structure 66 or 76, and in some other embodiments, one surface of the metal plate 66-1 or 76-1 may be exposed to the outside through one surface of the cooling structure 66 or 76. Alternatively, in some other embodiments, the cooling structure 66 or 76 may not include the metal plate 66-1 or 76-1.

A first internal metal plate 75 may be formed on an upper surface of the cooling structure 76. The first internal metal plate 75 may be the metal plate which may be bonded by soldering or sintering. For example, the first internal metal plate 75 may be formed by applying at least one of nickel, silver, tin, lead, and copper to the upper surface of the cooling structure 76, and the application method may include the selective immersion in the metal solution, the paste application, the electroless plating, or the like. The application may be performed at a step of manufacturing the cooling structure 76. Meanwhile, a second internal metal plate 65 may be formed on a lower surface of the cooling structure 66, and the description of the first internal metal plate 75 may be referred to for the second internal metal plate 65.

The dual cooling semiconductor device 4 may further include cooling structures 67*a* and 67*b*. The cooling structure 66 may be attached to the cooling structure 67*a*, and the cooling structure 76 may be attached to the cooling structure 67*b*, for example, by the method of high temperature surface melting at about 600 degrees Celsius or more, oxide film melting, or direct attachment of aluminum or copper at about 1000 degrees Celsius or more. In detail, an upper surface of the cooling structure 66 may be attached to a lower surface of the cooling structure 67*a* including coolant entrances 68*a* and 68*b*, and a lower surface of the cooling structure 76 may be attached to an upper surface of the cooling structure 67*b* including coolant entrances 68*c* and 68*d*.

In the manufacturing process, the first internal metal plate 75 may first be formed on the upper surface of the cooling structure 76, and the lower surface of the cooling structure 76 may then be bonded to the cooling structure 67*b*. Alternatively, in an opposite order, the lower surface of the cooling structure 76 may first be bonded to the cooling structure 67*b*, and the first internal metal plate 75 may then be formed on the upper surface of the cooling structure 76. Likewise, the second internal metal plate 65 may first be formed on the lower surface of the cooling structure 66, and the upper surface of the cooling structure 66 may then be bonded to the cooling structure 67*a*. Alternatively, in an opposite order, the upper surface of the cooling structure 66 may first be bonded to the cooling structure 67*a*, and the second internal metal plate 65 may then be formed on the lower surface of the cooling structure 66.

The dual cooling semiconductor device 4 may further include a molded resin layer 69 filling its interior. The molded resin layer 69 may entirely cover the cooling structures 67*a* and 67*b*, and expose only the coolant entrances 68*a*, 68*b*, 68*c*, and 68*d*.

A third internal metal plate 73 may be formed on the first internal metal plate 75. The third internal metal plate 73 may serve to support semiconductor chips 60 and 71. The first internal metal plate 75 and the third internal metal plate 73 may be bonded to each other through a solder layer or sintered bonding layer 74.

The semiconductor chips 60 and 71 may be the power semiconductor devices as described above with reference to FIG. 1. The semiconductor chip 60 or 71 may be attached to the third internal metal plate 73 through a solder layer or sintered bonding layer 59 or 72. In some embodiments, the wire connection may be formed between the semiconductor chip 60 or 71 and the third internal metal plate 73 as needed.

Metal blocks 62 and 69 may respectively be formed on the semiconductor chips 60 and 71. Meanwhile, a fourth internal metal plate 63 having the metal block insertion hole may be formed below the second internal metal plate 65. Here, a cross-sectional shape of the metal block insertion hole may be circular and each cross-sectional shape of the metal blocks 62 and 69 may also be circular. The metal blocks 62 and 69 may respectively be inserted into the metal block insertion holes formed in the fourth internal metal plate 63 through the mechanical pressure, and firmly fixed thereto. A cross-sectional diameter of the metal block 62 or 69 and a cross-sectional diameter of the metal block insertion hole may be determined to ensure a sufficient fixing force between the two elements. For example, the cross-sectional diameter of the metal block insertion hole may be the same as or slightly smaller than the cross-sectional diameter of the metal block 62 or 69. In some embodiments, a cross section of the metal block 62 or 69 and a cross section of the metal block insertion hole may be formed in a shape other than the circular shape. The structure of the metal block 62 or 69 and the structure of the fourth internal metal plate 63 may provide the sufficient fixing force to the internal elements of the semiconductor device 4 while making assembly of the semiconductor device 4 and its manufacturing process easier, thereby improving the assembly completeness of the semiconductor device 4.

A lower surface of the metal block 62 or 69 may be attached to the semiconductor chip 60 or 71 through a solder layer or sintered bonding layer 61 or 70. In addition, each upper surface of the metal blocks 62 and 69 and the fourth internal metal plate 63 may be attached to the second internal metal plate 65 through a solder layer or sintered bonding layer 64.

According to this embodiment, the assembly process of the external cooling structure (for example, the external cooling structure 13 in FIG. 2 or the external cooling structure 93 in FIG. 6) may be simplified, and only the coolant entrances 68*a*, 68*b*, 68*c*, and 68*d* may be required to be connected, thus having the increased manufacturing convenience. In addition, the thermally conductive electrical insulation layer such as the cooling structure 66 or 76 may be protected by the resin layer 69. Therefore, these layers may prevent microcracks which may occur due to a pressure when the cooling structure 66 or 76 is coupled with the external cooling structure. In addition, the metal plates operated electrically in the dual cooling semiconductor device 4 may not be exposed. Therefore, it is possible to omit the post-molding polishing process for removing the resin or the pre-molding film attachment process for preventing the resin from flowing out, thus simplifying the manufacturing process and saving the cost and time.

Figure 5:
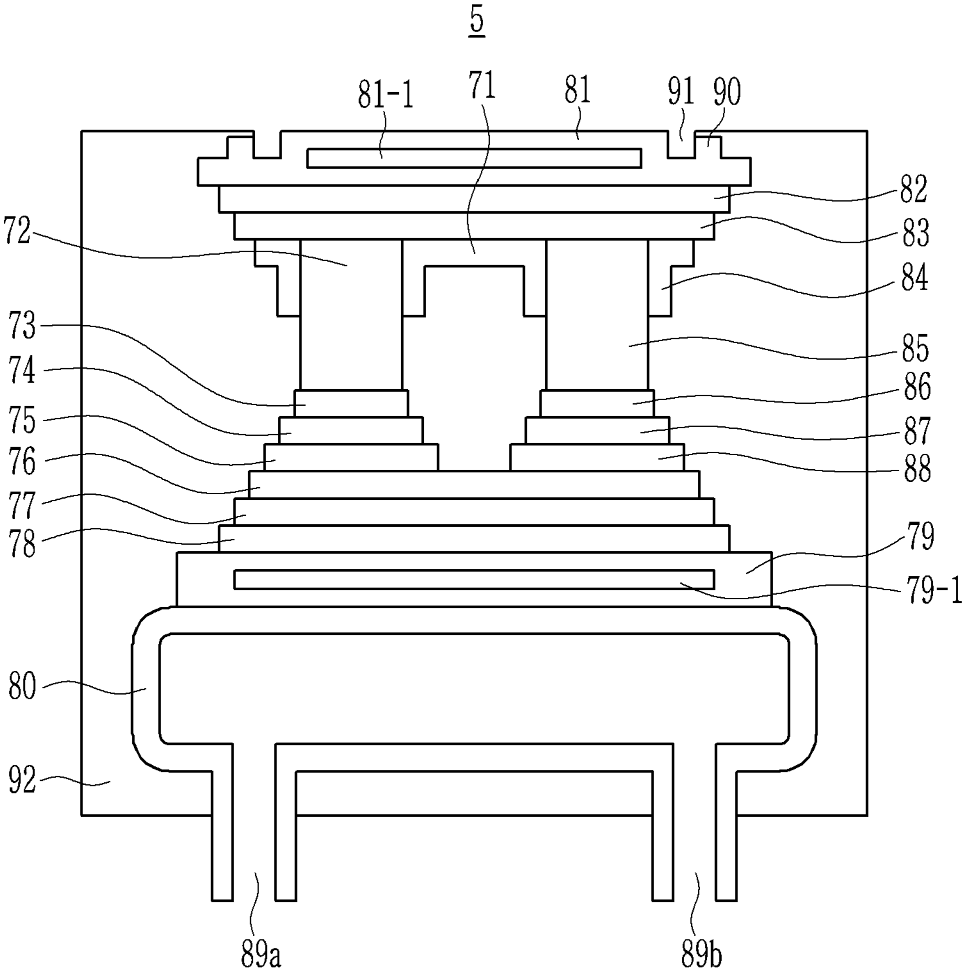
FIG. 5 is a diagram for explaining a dual cooling semiconductor device according to an embodiment.
Figure 6:
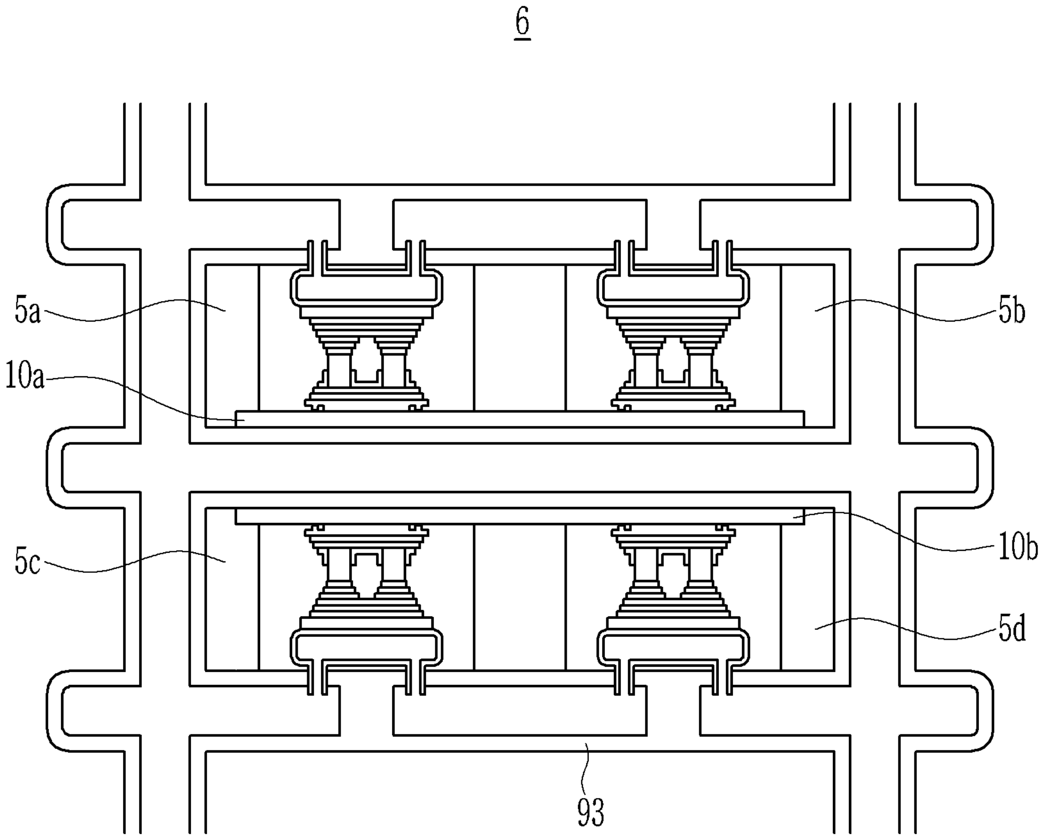
FIG. 6 is a diagram for explaining a dual cooling semiconductor system according to an embodiment.

FIG. 5 is a diagram for explaining a dual cooling semiconductor device according to an embodiment, and FIG. 6 is a diagram for explaining a dual cooling semiconductor system according to an embodiment.

Referring to FIG. 5, a dual cooling semiconductor device 5 according to an embodiment may include cooling structures 79 and 81.

The cooling structures 79 and 81 may each include the thermally conductive electrical insulation layer. The thermally conductive electrical insulation layer may be manufactured using the thermally conductive material having the electrically insulating feature. For example, the thermally conductive electrical insulation layer may include the ceramic material. As another example, the thermally conductive electrical insulation layer may include the polymer composite material in the form of the composite material in which the large amount of polymer material and the metal-based, carbon-based, or ceramic-based filler are mixed with each other. As still another example, the thermally conductive electrical insulation layer may include the material powdered as the powders having the high heat transfer feature as well as the high insulating feature, such as aluminum oxide ($Al_2O_3$), aluminum nitride (AlN), silicon nitride ($Si_3N_4$), and then processed at the high temperature (e.g., about 600 degrees Celsius or more). In this way, it is possible to improve the deterioration, shorter lifespan, and lower reliability of its product that may occur due to the greatly increased heat density in the limited area by selecting such the thermally conductive electrical insulation layer as the heat control material.

In some embodiments, the cooling structures 79 and 81 may respectively further include metal plates 79-1 and 81-1. When forming the powders of the thermally conductive electrical insulation layer, the metal plates 79-1 and 81-1 may be disposed in the cooling structures 79 and 81. The cooling structure 79 or 81 may include the metal plate 79-1 or 81-1 to thus increase the thermal conductivity of the thermally conductive electrical insulation layer, thus preventing microcracks which may occur due to a pressure when the cooling structure 79 or 81 is coupled with the external cooling structure 93.

In some embodiments, the metal plate 79-1 or 81-1 may be included without any surface exposed into the cooling structure 79 or 81, and in some other embodiments, one surface of the metal plate 79-1 or 81-1 may be exposed to the outside through one surface of the cooling structure 79 or 81. Alternatively, in some other embodiments, the cooling structure 79 or 81 may not include the metal plate 79-1 or 81-1.

The dual cooling semiconductor device 5 may further include a molded resin layer 92. The molded resin layer 92 may correspond to the electrical insulation layer. In some embodiments, the dual cooling semiconductor device 5 may include one or more molded resin flowing-out prevention concavo-convex structures 90 and 91. The molded resin flowing-out prevention concavo-convex structures 90 and 91 may prevent the resin from flowing out when the molded resin layer 92 fills the space between the cooling structures 79 and 81. Due to the molded resin flowing-out prevention concavo-convex structures 90 and 91, it is possible to omit the post-molding polishing process for removing the flowing-out resin or the pre-molding film attachment process for preventing the resin from flowing out, thus simplifying the manufacturing process and saving the cost and time. In addition, the molded resin layer 92 may entirely cover the cooling structure 80, and expose only coolant entrances 89*a* and 89*b*.

A first internal metal plate 78 may be formed on an upper surface of the cooling structure 79. The first internal metal plate 78 may be the metal plate which may be bonded by soldering or sintering. For example, the first internal metal plate 78 may be formed by applying at least one of nickel, silver, tin, lead, and copper to the upper surface of the cooling structure 79, and the application method may include the selective immersion in the metal solution, the paste application, the electroless plating, or the like. The application may be performed at a step of manufacturing the cooling structure 79. Meanwhile, a second internal metal plate 82 may be formed on a lower surface of the cooling structure 81, and the description of the first internal metal plate 78 may be referred to for the second internal metal plate 82.

The dual cooling semiconductor device 5 may further include a cooling structure 80. The cooling structure 79 or 81 may be attached to the cooling structure 79, for example, by the method of high temperature surface melting at about 600 degrees Celsius or more, oxide film melting, or direct attachment of aluminum or copper at about 1000 degrees Celsius or more. A lower surface of the cooling structure 79 may be attached to an upper surface of the cooling structure 80 including the coolant entrances 89*a* and 89*b*.

In the manufacturing process, the first internal metal plate 78 may first be formed on the upper surface of the cooling structure 79, and the lower surface of the cooling structure 79 may then be bonded to the cooling structure 80. Alternatively, in an opposite order, the lower surface of the cooling structure 79 may first be bonded to the cooling structure 80, and the first internal metal plate 78 may then be formed on the upper surface of the cooling structure 79.

A third internal metal plate 76 may be formed on the first internal metal plate 78. The third internal metal plate 76 may serve to support semiconductor chips 74 and 87. The first internal metal plate 78 and the third internal metal plate 76 may be bonded to each other through a solder layer or sintered bonding layer 77. In the embodiments, the solder layer may include, for example, silver, tin, lead, copper, or a combination of these metals, and the sintered bonding layer may include silver, copper, or a combination of these metals.

The semiconductor chips 74 and 87 may be the power semiconductor devices as described above with reference to FIG. 1. The semiconductor chip 74 or 87 may be attached to the third internal metal plate 76 through a solder layer or sintered bonding layer 75 or 88. In some embodiments, the wire connection may be formed between the semiconductor chip 74 or 87 and the third internal metal plate 76 as needed.

Metal blocks 72 and 85 may respectively be formed on the semiconductor chips 74 and 87. Meanwhile, a fourth internal metal plate 84 having the metal block insertion hole may be formed below the second internal metal plate 82. Here, a cross-sectional shape of the metal block insertion hole may be circular and each cross-sectional shape of the metal blocks 72 and 85 may also be circular. The metal blocks 72 and 85 may respectively be inserted into the metal block insertion holes formed in the fourth internal metal plate 84 through the mechanical pressure, and firmly fixed thereto. A cross-sectional diameter of the metal block 72 or 85 and a cross-sectional diameter of the metal block insertion hole may be determined to ensure a sufficient fixing force between the two elements. For example, the cross-sectional diameter of the metal block insertion hole may be the same as or slightly smaller than the cross-sectional diameter of the metal block 72 or 85. In some embodiments, a cross section of the metal block 72 or 85 and a cross section of the metal block insertion hole may be formed in the shape other than the circular shape. The structure of the metal block 72 or 85 and the structure of the fourth internal metal plate 84 may provide the sufficient fixing force to the internal elements of the semiconductor device 5 while making assembly of the semiconductor device 5 and its manufacturing process easier, thereby improving the assembly completeness of the semiconductor device 5.

A lower surface of the metal block 72 or 85 may be attached to the semiconductor chip 74 or 87 through a solder layer or sintered bonding layer 73 or 86. In addition, each upper surface of the metal blocks 72 and 85 and the fourth internal metal plate 84 may be attached to the second internal metal plate 82 through a solder layer or sintered bonding layer 83.

Next, referring to FIG. 6, a semiconductor device 5*a*, 5*b*, 5*c*, or 5*d* manufactured as described with reference to FIG. 5 may be connected to the external cooling structure 93 through the interconnection layer 10*a* or 10*b*, which is made of the thermal conductivity material, to thus form a semiconductor system 6. The coolant may flow in the external cooling structure 93. In general, the external cooling structure 93 may be made of the metal material, and the electrical short circuit may thus occur if the semiconductor device 5*a*, 5*b*, 5*c*, or 5*d* is assembled between the external cooling structures 93. To prevent the short circuit, a layer having the thermal conductivity and the electrical insulation may need to be formed between the semiconductor device 5*a*, 5*b*, 5*c*, or 5*d* and the external cooling structure 93.

As described above with reference to FIG. 5, the cooling structure 81 may be already formed as the electrical insulation layer in the semiconductor device 5*a*, 5*b*, 5*c*, or 5*d*. Therefore, the interconnection layer 10*a* or 10*b* may only need to have the thermal conductivity and may not necessarily have to have the electrical insulation. Therefore, according to this embodiment, it is possible to prevent the electrical short circuit, simplify the manufacturing and assembly processes, and it may also be advantageous in terms of the size of semiconductor device 5_a_, 5_b_, 5_c_, or 5_d_ by simply forming the interconnection layer 10_a_ or 10_b_ having the one-layer structure.

In addition, the assembly process of the external cooling structure 93 may be simplified, and only the coolant entrances 89_a_ and 89_b_ may be required to be connected, thus having the increased manufacturing convenience. In addition, the thermally conductive electrical insulation layer such as the cooling structures 79 and 81 may be protected by the resin layer 92. Therefore, these layers may prevent microcracks which may occur due to a pressure when the cooling structure 79 or 81 is coupled with the external cooling structure. In addition, the metal plates operated electrically in the dual cooling semiconductor device 5 may not be exposed. Therefore, it is possible to omit the post-molding polishing process for removing the resin or the pre-molding film attachment process for preventing the resin from flowing out, thus simplifying the manufacturing process and saving the cost and time.

Although the embodiments of the disclosure have been described in detail hereinabove, the scope of the disclosure is not limited thereto. That is, various modifications and alterations made by those skilled in the art to which the disclosure pertains by using a basic concept of the disclosure as defined in the following claims also fall within the scope of the disclosure.

What is claimed is:

1. A dual cooling semiconductor device comprising:

a first cooling structure and a second cooling structure each including a thermally conductive electrical insulation layer;

a first internal metal plate formed on an upper surface of the second cooling structure;

a second internal metal plate formed on a lower surface of the first cooling structure;

a third internal metal plate formed on the first internal metal plate and supporting a semiconductor chip;

a metal block formed on the semiconductor chip; and a fourth internal metal plate formed below the second internal metal plate and having a metal block insertion hole into which the metal block is inserted.

2. The dual cooling semiconductor device of claim 1, wherein the first cooling structure includes a first metal plate therein; and the second cooling structure includes a second metal plate therein.

3. The dual cooling semiconductor device of claim 1, further comprising one or more molded resin flowing-out prevention concavo-convex structures.

4. The dual cooling semiconductor device of claim 1, wherein a cross-sectional shape of the metal block insertion hole and a cross-sectional shape of the metal block are circular.

5. The dual cooling semiconductor device of claim 1, further comprising a third cooling structure attached to a lower surface of the second cooling structure and including one or more coolant entrances.

6. The dual cooling semiconductor device of claim 5, further comprising a fourth cooling structure attached to the lower surface of the first cooling structure and including one or more coolant entrances.

7. The dual cooling semiconductor device of claim 1, wherein a third cooling structure and a fourth cooling structure form one cooling structure and are formed by a bent or deformed metal.

8. A dual cooling semiconductor system comprising:

the dual cooling semiconductor device of claim 1;

an external cooling structure; and an interconnection layer including a thermal conductivity material and connecting the dual cooling semiconductor device with the external cooling structure.

* * * * *